United States Patent
Ahn et al.

(10) Patent No.: US 10,008,638 B2
(45) Date of Patent: Jun. 26, 2018

(54) METHOD FOR MANUFACTURING OPTICAL ELEMENT FOR BACKLIGHT UNIT AND OPTICAL ELEMENT AND OPTICAL ELEMENT ARRAY MANUFACTURED BY METHOD

(71) Applicant: Point Engineering Co., Ltd., Asan-si, Chungcheongnam-do (KR)

(72) Inventors: Bum Mo Ahn, Yongin-si (KR); Seung Ho Park, Hwaseong-si (KR); Ki Myung Nam, Cheonan-si (KR)

(73) Assignee: Point Engineering Co., Ltd., Asan-si, Chungcheongnam-do (KR)

( * ) Notice: Subject to any disclaimer, the term of this patent is extended or adjusted under 35 U.S.C. 154(b) by 620 days.

(21) Appl. No.: 14/400,196

(22) PCT Filed: May 9, 2013

(86) PCT No.: PCT/KR2013/004066
§ 371 (c)(1),
(2) Date: Nov. 10, 2014

(87) PCT Pub. No.: WO2013/169022
PCT Pub. Date: Nov. 14, 2013

(65) Prior Publication Data
US 2015/0098209 A1  Apr. 9, 2015

(30) Foreign Application Priority Data
May 11, 2012 (KR) .................. 10-2012-0050157

(51) Int. Cl.
H05K 3/30 (2006.01)
H01L 33/48 (2010.01)
(Continued)

(52) U.S. Cl.
CPC ............ *H01L 33/486* (2013.01); *H01L 24/97* (2013.01); *H01L 25/13* (2013.01); *H05K 1/181* (2013.01);
(Continued)

(58) Field of Classification Search
CPC ........ H05K 1/18; H05K 1/181; H01L 33/486; H01L 24/97; H01L 25/131; F21S 2/00;
(Continued)

(56) References Cited

U.S. PATENT DOCUMENTS 5,525,204 A * 6/1996 Shurboff ............. H01L 21/4853
                                                    205/125
6,079,099 A * 6/2000 Uchida ................. H05K 3/3405
                                                    174/382
(Continued)

FOREIGN PATENT DOCUMENTS

CN       1534355 A    10/2004
CN     101165570 A     4/2008
(Continued)

OTHER PUBLICATIONS

International Searching Authority, International Search Report—International Application No. PCT/KR2011/008943 (WO 2013/002460 A2), dated May 17, 2012, 2 pages.
(Continued)

*Primary Examiner* — Peter DungBa Vo
*Assistant Examiner* — Kaying Kue
(74) *Attorney, Agent, or Firm* — Sunstein Kann Murphy & Timbers LLP

(57) ABSTRACT

The present invention relates to a method of manufacturing an optical device for a back light unit, and an optical device and an optical device array manufactured by the method, in which optical device chips constituting the optical device array are each laid the sides thereof on a printed circuit board
(Continued)

in such a manner that light can be emitted from the optical device chips in a lateral direction, thus reducing the overall thickness of the back light unit.

Provided is a method of manufacturing an optical device for a back light unit, the method comprising: (a) preparing an original substrate having vertical insulating layers interposed therebetween; (b) partially cutting the original substrate to a predetermined depth from an upper surfaces thereof such that the cut portion is orthogonal at least to the vertical insulation layers, and exposing a region where a plating layer for soldering is to be formed; (c) performing plating; (d) mounting optical device chips on a plurality of chip substrate regions divided to include the vertical insulating layers; and (e) cutting each chip substrate region.

2 Claims, 39 Drawing Sheets

(51) Int. Cl.
| H05K 1/18 | (2006.01) |
| H05K 3/34 | (2006.01) |
| H01L 23/00 | (2006.01) |
| H01L 25/13 | (2006.01) |
| H05K 3/00 | (2006.01) |
| H01L 33/62 | (2010.01) |

(52) U.S. Cl.
CPC ......... *H05K 3/0052* (2013.01); *H05K 3/3442* (2013.01); *H01L 33/62* (2013.01); *H01L 2224/48091* (2013.01); *H01L 2924/12041* (2013.01); *H05K 3/3452* (2013.01); *H05K 2201/10106* (2013.01); *Y02P 70/611* (2015.11); *Y02P 70/613* (2015.11); *Y10T 29/41* (2015.01); *Y10T 29/49117* (2015.01)

(58) Field of Classification Search
CPC ............. G02F 1/13357; Y10T 29/4913; Y10T 29/49165; Y10T 29/49155; Y10T 29/41; Y10T 29/49117
USPC .......................................... 29/832, 846, 852
See application file for complete search history.

(56) References Cited

U.S. PATENT DOCUMENTS

| 6,493,934 | B2* | 12/2002 | Akram | ............... | B28D 5/024 |
| | | | | | 29/825 |
| 7,070,114 | B2* | 7/2006 | Cho | ................ | G06K 19/07749 |
| | | | | | 235/375 |
| 7,632,002 | B1 | 12/2009 | Park et al. | ................ | 362/616 |
| 7,876,196 | B2* | 1/2011 | Tamaki | ................ | H01C 1/14 |
| | | | | | 29/610.1 |
| 7,905,617 | B2 | 3/2011 | Yun et al. | ................ | 362/97.1 |
| 7,982,139 | B2* | 7/2011 | Kariya | ................ | H05K 1/162 |
| | | | | | 174/260 |
| 7,989,928 | B2* | 8/2011 | Liao | ................ | H01L 21/568 |
| | | | | | 257/659 |
| 8,242,592 | B2* | 8/2012 | Kusumoto | ....... | G06K 19/07749 |
| | | | | | 257/692 |
| 8,258,526 | B2 | 9/2012 | Park et al. | ................ | 257/98 |
| 8,338,912 | B2* | 12/2012 | Oka | ................ | H01L 23/552 |
| | | | | | 257/531 |
| 8,746,932 | B2* | 6/2014 | Ide | ................ | H01L 33/486 |
| | | | | | 257/100 |
| 9,158,151 | B2* | 10/2015 | Ogata | ................ | G02F 1/133603 |
| 9,559,268 | B2* | 1/2017 | Ahn | ................ | H01L 25/13 |
| 9,768,362 | B2* | 9/2017 | Park | ................ | H01L 33/483 |
| 2003/0098459 | A1* | 5/2003 | Horiuchi | ................ | H01L 33/486 |
| | | | | | 257/81 |
| 2003/0189829 | A1* | 10/2003 | Shimizu | ................ | F21L 4/00 |
| | | | | | 362/240 |
| 2004/0208210 | A1* | 10/2004 | Inoguchi | ................ | H01L 25/0753 |
| | | | | | 372/36 |
| 2006/0246617 | A1* | 11/2006 | Lee | ................ | H01L 33/486 |
| | | | | | 438/26 |
| 2008/0001280 | A1 | 1/2008 | Kusumoto | ................ | 257/692 |
| 2008/0094536 | A1 | 4/2008 | Kim | ................ | 349/58 |
| 2010/0001306 | A1 | 1/2010 | Park et al. | ................ | 257/99 |
| 2010/0073903 | A1 | 3/2010 | Yun et al. | ................ | 362/97.1 |
| 2010/0213599 | A1* | 8/2010 | Watanabe | ................ | H01L 23/13 |
| | | | | | 257/693 |
| 2011/0171776 | A1* | 7/2011 | Kusumoto | ....... | G06K 19/07749 |
| | | | | | 438/106 |
| 2011/0199787 | A1 | 8/2011 | Kim et al. | ................ | 362/612 |
| 2011/0303936 | A1* | 12/2011 | Wu | ................ | H01L 33/62 |
| | | | | | 257/98 |
| 2012/0138990 | A1* | 6/2012 | Sato | ................ | H01L 33/641 |
| | | | | | 257/98 |
| 2012/0206673 | A1* | 8/2012 | Ogata | ................ | G02F 1/133603 |
| | | | | | 349/69 |
| 2012/0313115 | A1* | 12/2012 | Joo | ................ | H01L 33/486 |
| | | | | | 257/88 |

FOREIGN PATENT DOCUMENTS

| DE | 2065346 A1 | 5/1973 | |
| JP | 09-055535 | 2/1997 | |
| JP | 2001-044317 | 2/2001 | |
| JP | 2003-309292 | 10/2003 | |
| JP | 2009-105270 | 5/2009 | |
| JP | 4925296 | 4/2012 | |
| KR | 10-2007-0039006 | 4/2007 | |
| KR | 10-2009-0118640 | 11/2009 | ............ F21S 2/00 |
| KR | 10-2010-0110152 | 10/2010 | |
| KR | 10-2011-0109651 | 10/2011 | ............ H01L 33/62 |
| KR | 10-2011-0120728 | 11/2011 | ............ H01L 33/48 |
| KR | 10-1101134 | 1/2012 | ............ H01L 33/62 |
| WO | WO 2006/070457 | 7/2006 | |
| WO | WO 2011/122846 A2 | 10/2011 | |
| WO | WO 2011/122847 A2 | 10/2011 | ............ H01L 33/62 |

OTHER PUBLICATIONS

Office Action, The State Intellectual Property Office of the People's Republic of China, First Office Action—Application No. 20138002644.8, 18 pages, dated Dec. 29, 2015.

International Searching Authority, International Search Report—International Application No. PCT/KR2013/004066, dated Aug. 5, 2013.

The International Bureau of WIPO, International Preliminary Report on Patentability, International App. No. PCT/KR2013/004066; 5 pages, dated Aug. 5, 2013.

The International Bureau of WIPO (English Translation), International Preliminary Report on Patentability, International App. No. PCT/KR2013/004066; 5 pages, dated Aug. 5, 2013.

\* cited by examiner

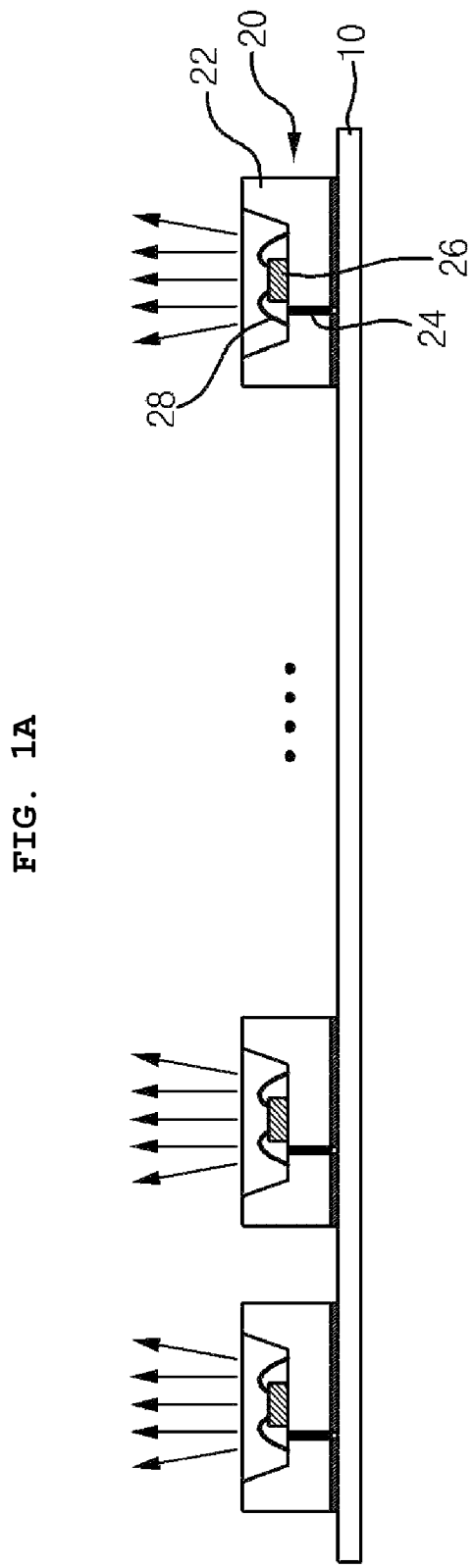

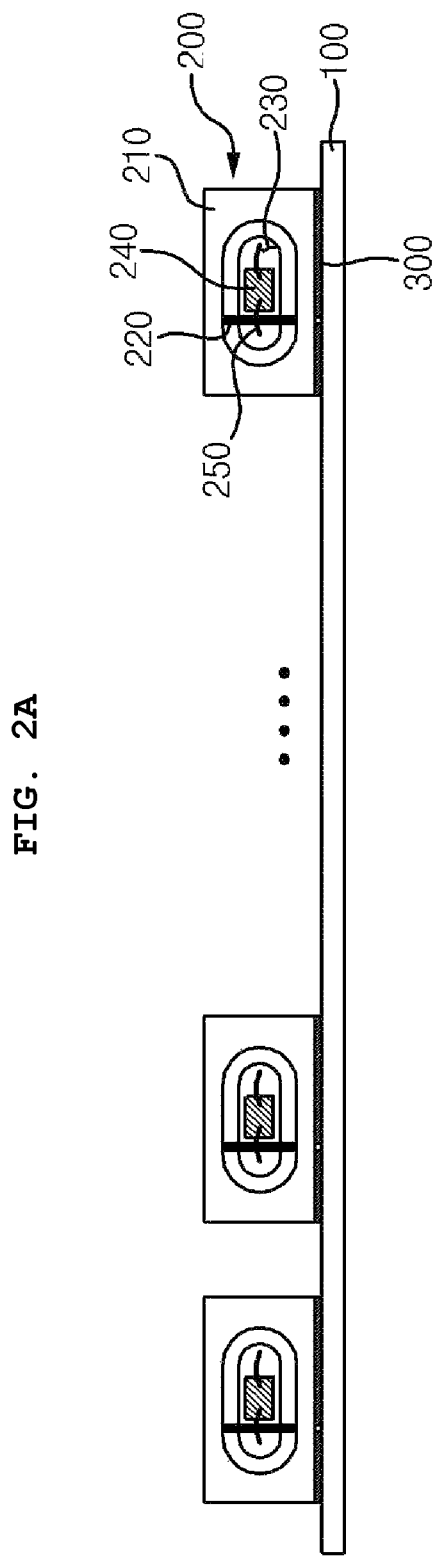

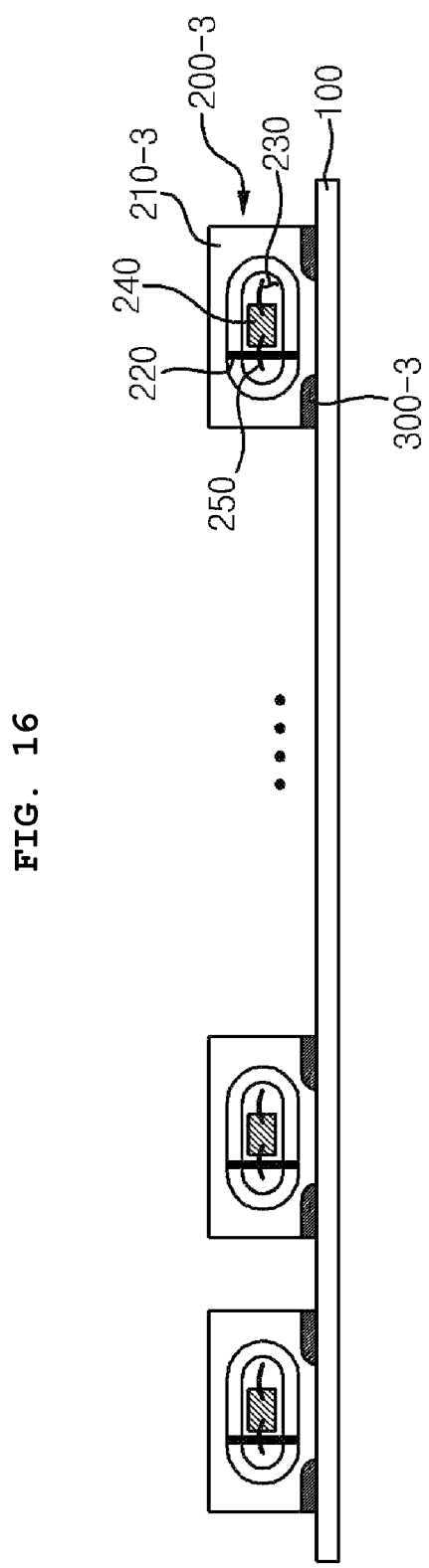

ically be emitted from a lateral side of the flat panel display.

METHOD FOR MANUFACTURING OPTICAL ELEMENT FOR BACKLIGHT UNIT AND OPTICAL ELEMENT AND OPTICAL ELEMENT ARRAY MANUFACTURED BY METHOD

TECHNICAL FIELD

This invention relates to a method of manufacturing an optical device for a back light unit, and an optical device and an optical device array manufactured by the method.

BACKGROUND ART

As is well known, liquid crystal displays (LCDs) are widely used as flat panel displays such as TVs, computer monitors, or the like. A back light unit (BLU) is a luminary part which emits light behind the LCD. Meanwhile, the BLU includes a light guide panel which guides the light incident from a side surface to a front surface. Recently, light emitting diode (LED) arrays have been used as side surface line light sources of light guide panels.

FIGS. 1A and 1B are a front view and a plan view of a conventional LED array, respectively. As shown in FIGS. 1A and 1B, in the LED array used as a conventional side surface line light source for a BLU, a plurality of LED chips 20 are disposed on a printed circuit board 10 at intervals. In each LED chip 20 of the above-described configuration, an LED chip 20 is bonded through wire bonding 28 on an upper surface of an aluminum substrate 22 (hereinafter referred to as "a chip substrate") with vertical insulating layer 24 interposed therebetween to provide mutual insulation. The LED chip 20 is mounted inside a cavity having a groove formed a predetermined depth from the upper surface of the chip substrate 22 in order to improve reflection performance. In this case, the chip substrate 22 insulated by the vertical insulating layer 24 may serve as a (+) or (−) electrode terminal.

Hereinafter, various devices including the LED, which emits light, are generically referred to as "an optical device," and a product in which two or more optical devices are arranged side-by-side in a matrix form is called "an optical device array."

However, according to the conventional optical device array described above, since the optical device chip is mounted on the printed circuit board in a supine state, the light is emitted from the optical device chip in an upward direction (based on FIG. 1A). Thus, as an overall thickness of corresponding back light (as a result, a flat panel display) depends on a width of the printed circuit board, there has been a problem reduction in a thickness of the flat panel display is limited.

SUMMARY OF INVENTION

Technical Problem

This invention is directed to providing a method of manufacturing an optical device for a back light unit, and an optical device and an optical device array manufactured by the method, in which optical device chips constituting the optical device array are each laid the sides thereof on a printed circuit board in such a manner that light may be emitted from the optical device chips in a lateral direction, thus reducing the overall thickness of the back light unit.

Solution to Problem

First feature of the present invention provides a method of manufacturing an optical device for a back light unit, the method including steps of: (a) preparing an original substrate having vertical insulating layers interposed therebetween; (b) partially cutting the original substrate to a predetermined depth from an upper surface thereof such that the cut portion is orthogonal at least to the vertical insulation layers, and exposing a region where a plating layer for soldering is to be formed; (c) performing plating; (d) mounting optical device chips on a plurality of chip substrate regions each divided to include the vertical insulating layers; and (e) cutting each chip substrate region.

In the above-described configuration, the method may further include (pb1) depositing a solder resist on the upper surface or a lower surface of the original substrate between step (a) and step (b).

In step (pb1), the solder resist may be deposited at least on the upper surface of the original substrate, the method may further comprise forming a cavity including a groove a predetermined depth from the upper surface and including the vertical insulating layer on the original substrate before step (pb1) and step (c), and step (d) may be performed inside the cavity.

The method may further include (pb2) forming through holes between which the vertical insulating layers are interposed between step (pb1) and step (b), and the partial cutting in step (b) may be performed along the through holes.

In step (pb1), a solder paste may be deposited at least on the upper surface of the original substrate.

The solder paste may be deposited in a state in which a region on which the optical device chips are mounted is masked.

Second feature of the present invention provides a method of manufacturing an optical device for a back light unit, the method including steps of: (a) preparing an original substrate having vertical insulating layers interposed therebetween; (pb1) depositing a solder resist on an upper surface or a lower surface of the original substrate; (pb2) forming through holes between which the vertical insulating layers are interposed; (c) performing plating; (d) mounting optical device chips on a plurality of chip substrate regions each divided to include the vertical insulating layers; and (e) cutting each chip substrate region.

In the above-described aspect, in step (pb1), the solder resist may be deposited at least on the upper surface of the original substrate, the method may further include forming a cavity including a groove a predetermined depth from the upper surface and including the vertical insulating layers on the original substrate before step (pb1) and step (c), and step (d) may be performed inside the cavity.

In the above-described aspect, in step (pb1), a solder paste may be deposited at least on the upper surface of the original substrate, and the solder paste may be deposited in a state in which a region on which the optical device chips are mounted is masked.

Third feature of the present invention provides an optical device for a back light unit manufactured by the manufacturing method of the first and second aspects.

Fourth feature of the present invention provides an optical device array for a back light unit manufactured by soldering a plurality of the optical devices according to the above aspects on a printed circuit board at intervals so that the optical devices are disposed to face a front surface while lying on their sides.

Advantageous Effects of Invention

According to a method of manufacturing an optical device for a back light unit of this invention, and an optical device and an optical device array manufactured by the method, in which optical device chips constituting the optical device array are each laid the sides thereof on a printed circuit board in such a manner that light can be emitted from the optical device chips in a lateral direction, thus reducing the overall thickness of the back light unit.

BRIEF DESCRIPTION OF DRAWINGS

FIGS. 1A and 1B are a front view and a plan view of a conventional light emitting diode (LED) array, respectively.

FIGS. 2A and 2B are a front view and a plan view of an LED array for a back light unit according to an embodiment of this invention, respectively.

FIG. 16 is a front view showing the LED chip shown in FIG. 14D mounted on a printed circuit board.

DETAILED DESCRIPTION OF EMBODIMENT

Hereinafter, exemplary embodiments of a method of manufacturing an optical device for a back light unit, and an optical device and an optical device array manufactured by the method will be described in detail with reference to the accompanying drawings. A light emitting diode (LED) will be described as an example of the optical device for convenience.

Figure 1B:
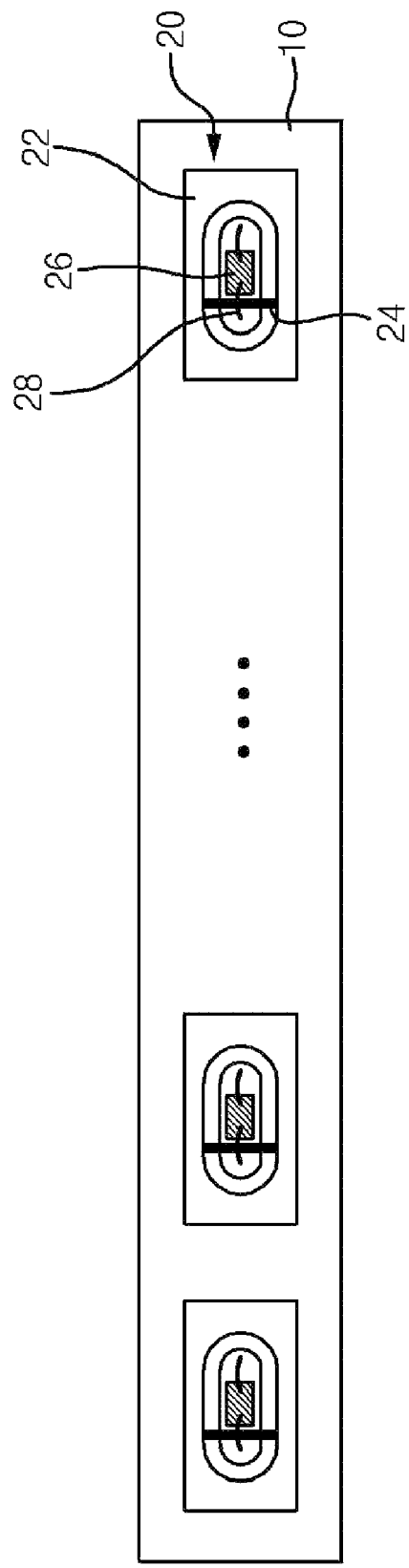
Figure 2B:
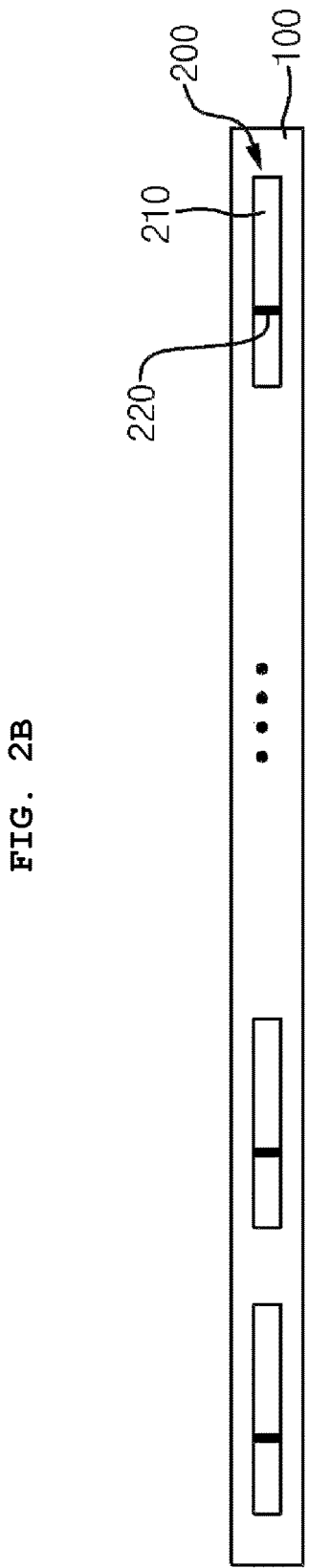

FIGS. 2A and 2B are a front view and a plan view of an LED array for a back light unit according to an embodiment of this invention, respectively. As shown in FIGS. 2A and 2B, in the LED array for a back light unit according to the embodiment of this invention, a plurality of LED chips 200 are disposed on a printed circuit board 100 of an elongated belt shape at intervals. In each LED device 200 of the above-described configuration, an LED chip 240 is bonded in through wire bonding 250 on an insulated chip substrate 210, with a vertical insulating layer 220 interposed therebetween, and the LED chip 240, for example, is mounted inside a cavity 230 having a shape with a wide top and a narrow bottom, which is formed a predetermined depth from an upper surface of the chip substrate 210 in order to improve reflection performance. In this case, the chip substrate 210 in which the vertical insulating layer 220 is interposed through a body may serve as a (+) or (−) electrode terminal. In the drawing, a reference numeral 300 shows a solder layer.

As shown in FIGS. 2A and 2B, according to the LED array for a back light unit according to the embodiment of this invention, since the LED device 200 is soldered 300 on the printed circuit board 100 while lying on its side, light is emitted from the LED device 200 in a front direction. Thus, a thickness (a height) of the printed circuit board 100 and a vertical length (a height) of the LED device 200 (based on FIG. 2A) may become an overall thickness (a height) of the LED array and a thickness of back light may be reduced. That is, since the printed circuit board 100 of the LED array according to the embodiment of this invention is disposed in parallel to the back light, the thickness of the back light may be reduced.

Figure 3:
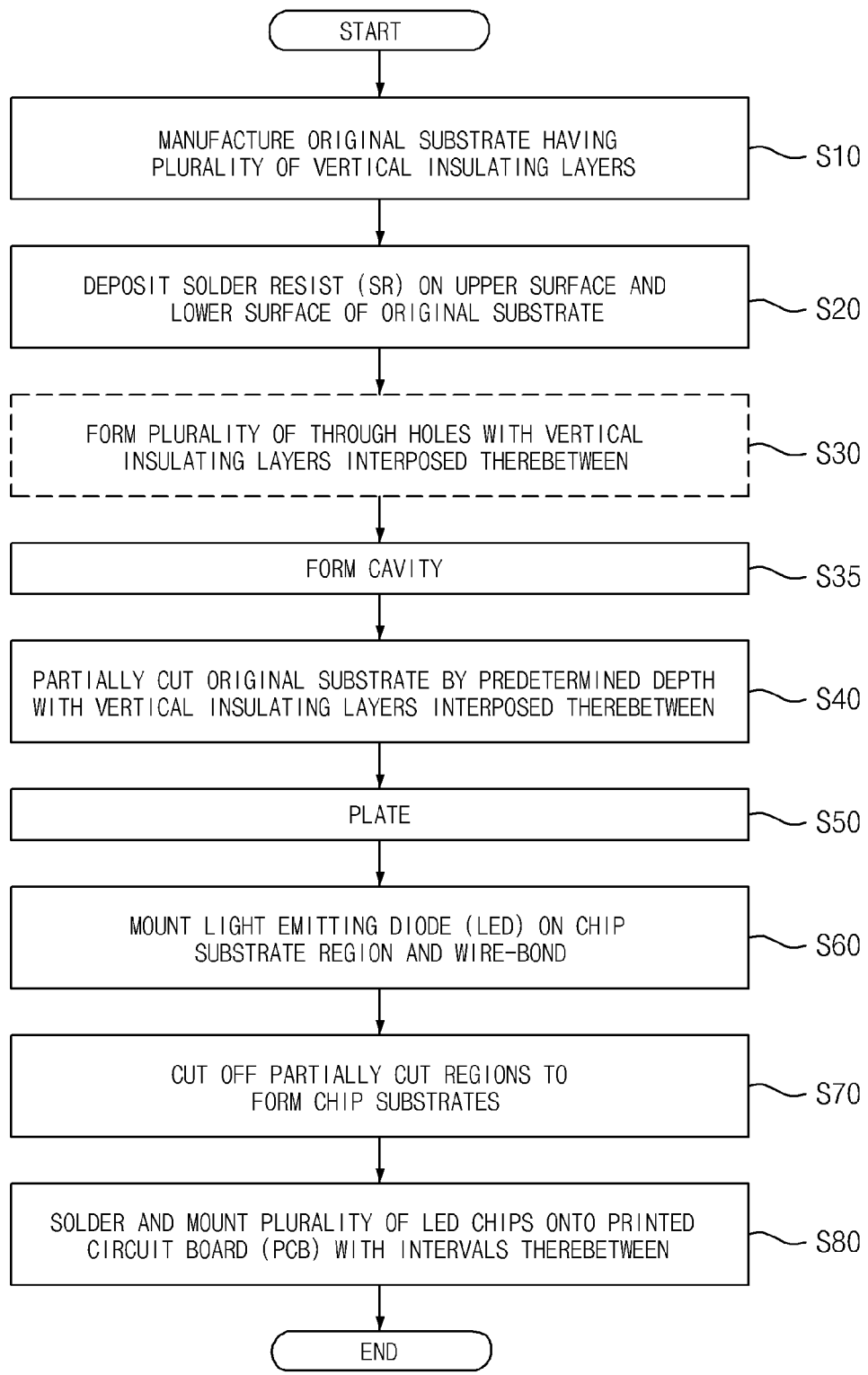
FIG. 3 is a flowchart for describing a method of manufacturing an optical device array for a back light unit according to an embodiment of this invention.
Figure 4A:
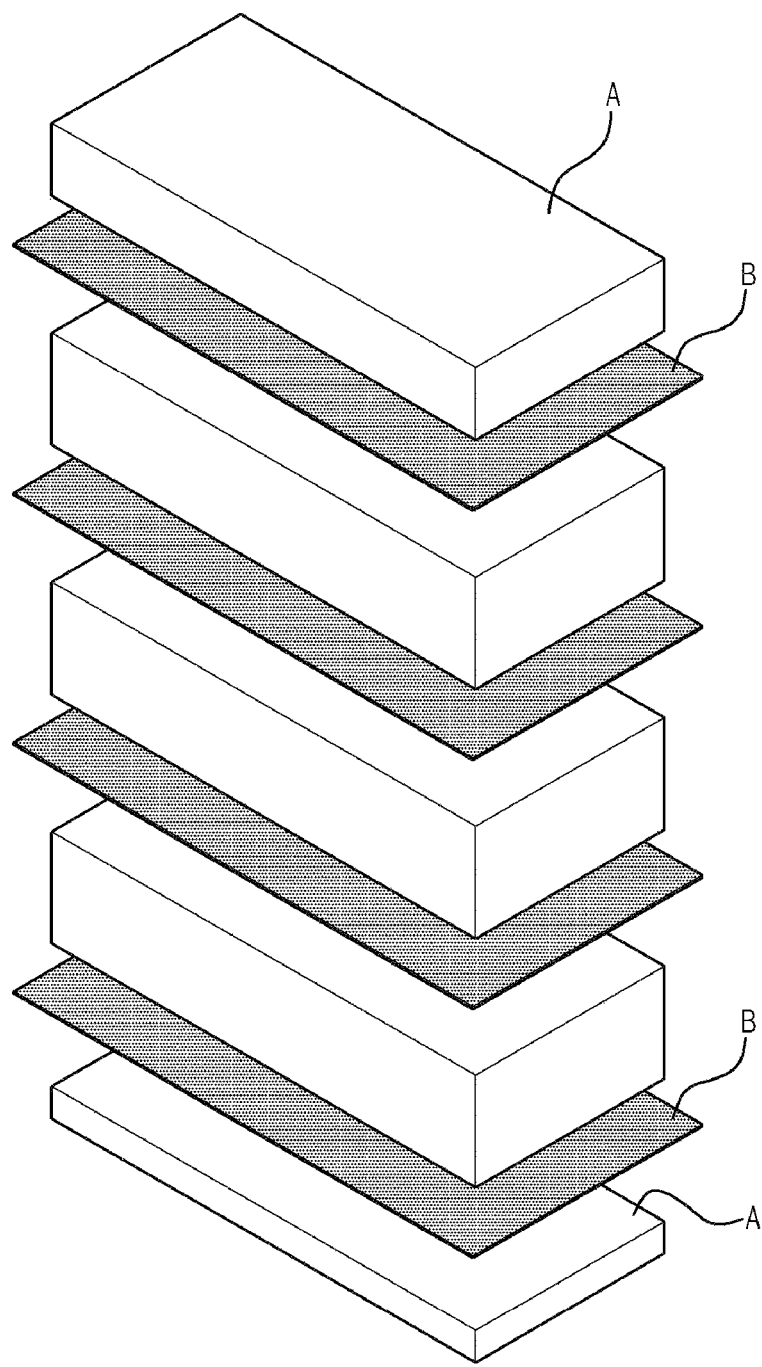
FIGS. 4A to 4C are views showing a process of manufacturing an optical device substrate having a vertical insulating layer.
Figure 4B:
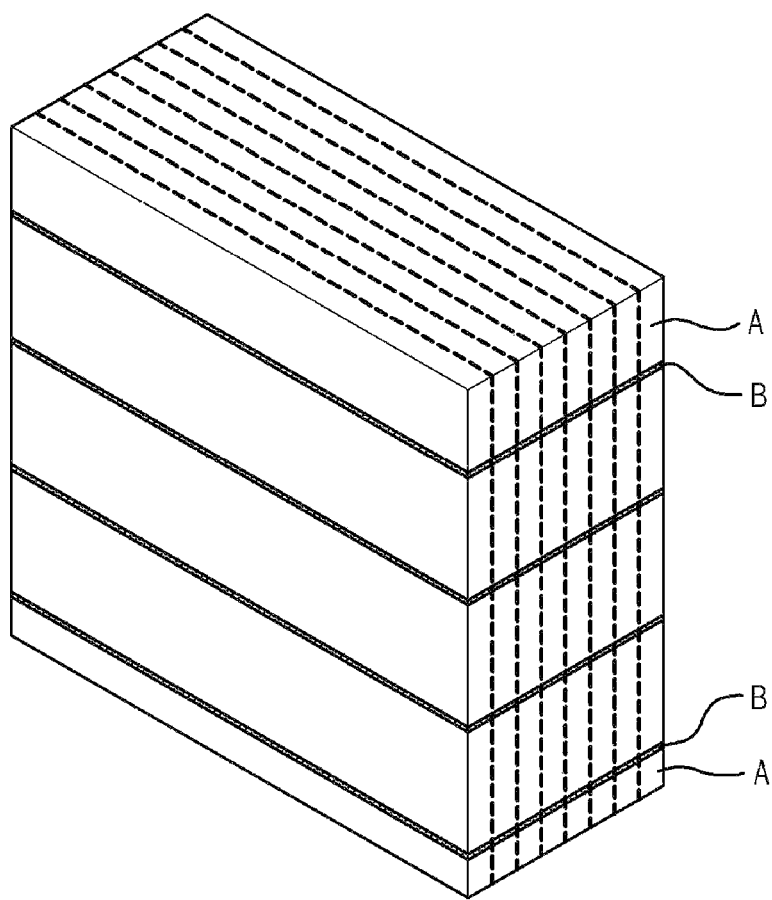
Figure 4C:
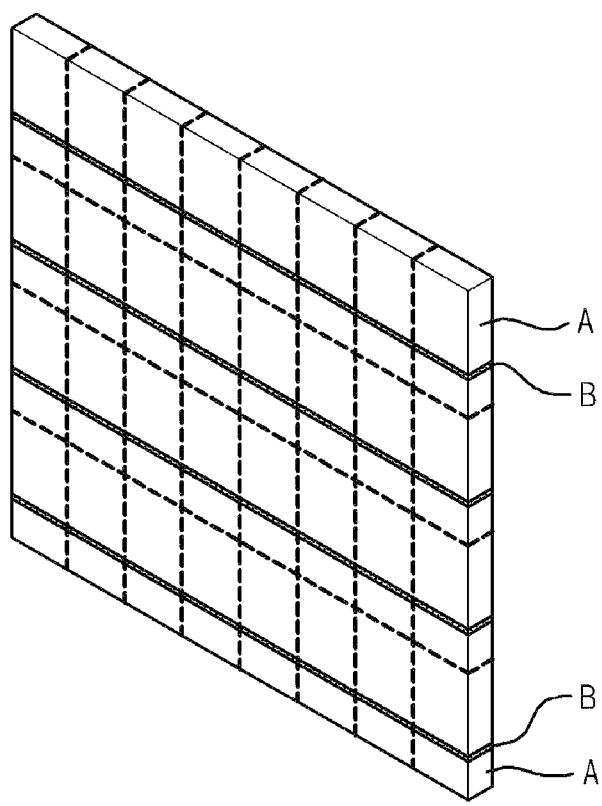

FIG. 3 is a flowchart for describing a method of manufacturing an optical device array for a back light unit according to the embodiment of this invention. FIGS. 4A to 4C are views showing a process of manufacturing an optical device substrate having a vertical insulating layer. As shown in FIG. 3, according to the embodiment of this invention, first, in step S10, an original substrate having a plurality of vertical insulating layers is manufactured. In this regard, as shown in FIG. 4A, a plurality of aluminum sheets A having a predetermined depth are bonded to be interposed between insulating layers B, and are heated and pressurized in a state in which the plurality of aluminum sheets A are stacked, and thus aluminum ingot in which a plurality of vertical insulating layers B are arranged at intervals is manufactured, as shown in FIG. 4B.

Next, the manufactured aluminum ingot is vertically cut to include an insulating layer B, as shown in a dotted line of FIG. 4B, for example, cut in a wire sawing method, and thus, manufacturing of the original substrate in which the plurality of vertical insulating layers B are arranged in parallel at intervals is completed as shown in FIG. 4C. The dotted line in FIG. 4C shows a cutting line to form each chip substrate.

Figure 5A:
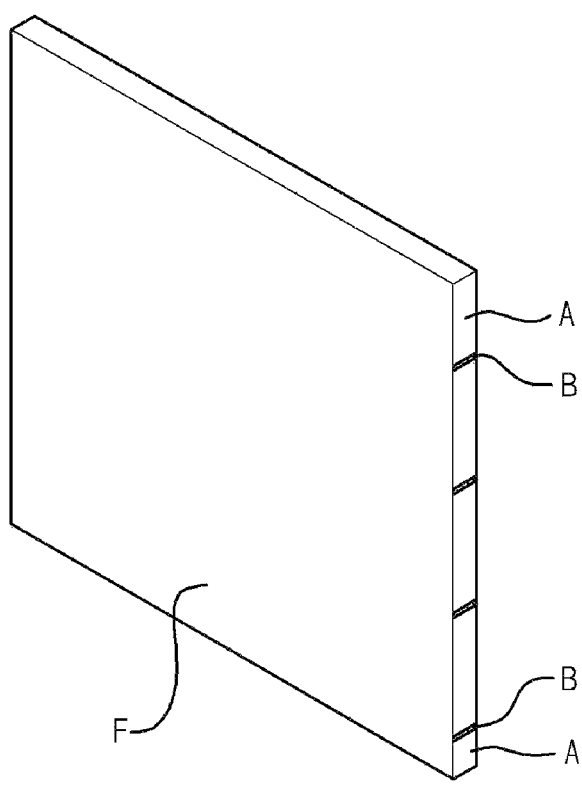
FIGS. 5A to 5E are views for describing a process of manufacturing an optical device for a back light unit according to an embodiment of this invention.

FIGS. 5A to 5E are views for describing a process of manufacturing the optical device for a back light unit according to the embodiment of this invention. Referring back to FIG. 3, in step S20, solder resists F, preferably, white solder resists having good light reflection performance, are deposited on an upper surface and a lower surface of the original substrate. FIG. 5A is a perspective view of the original substrate in a state in which the solder resist F is deposited. Step S20 is performed in order to prevent degradation of insulating performance as well as pollution and contamination due to a solder paste climbing up the chip substrate when the LED chip is soldered on the printed circuit board, to avoid wasting plating materials, and to improve light reflection performance.

Figure 5B:
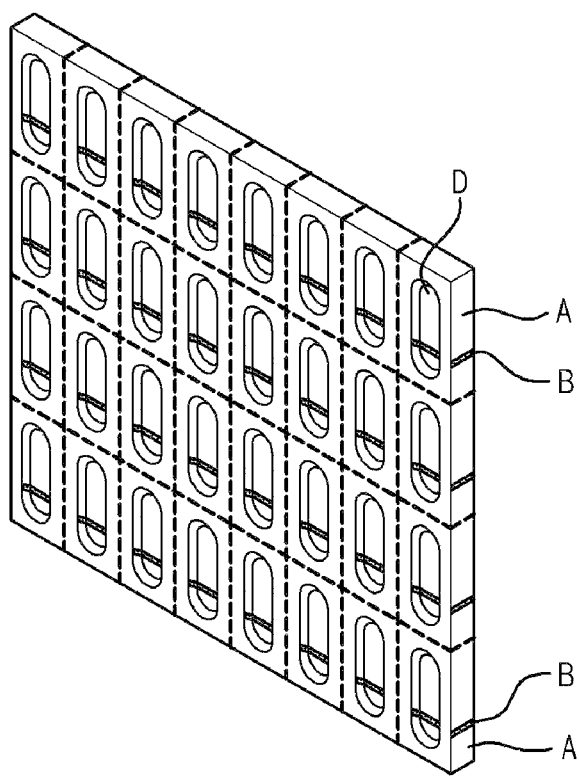
Figure 5C:
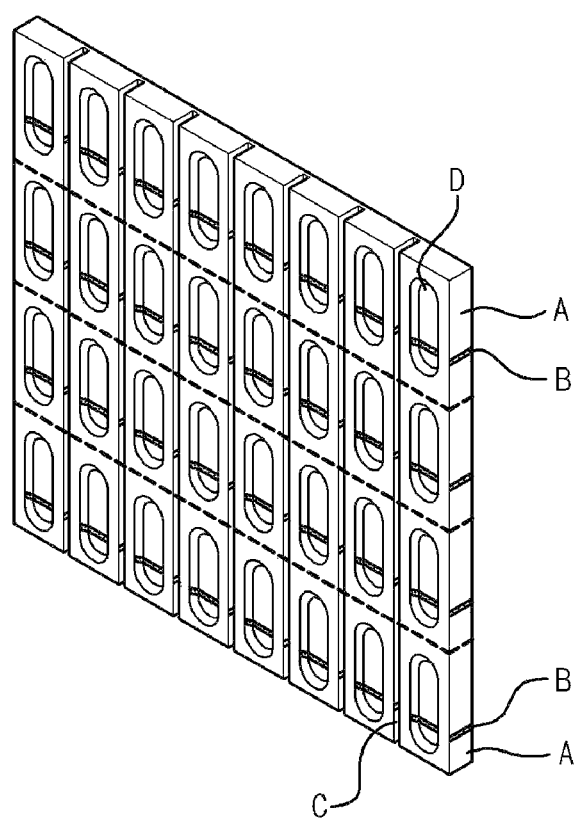

Next, in step S35, a cavity D a predetermined depth from an upper surface of the chip substrate is formed in each chip substrate region, as shown in FIG. 5B, for example, formed by a cutting process, etc. In this case, the vertical insulating layer B should pass through a bottom of the cavity D. The cavity D is preferably formed to have a shape with a wide top and a narrow bottom.

Meanwhile, a plating layer should be formed on a junction region to the printed circuit board 100 of the chip substrate 200 so that each chip substrate 200 is firmly soldered to the printed circuit board 100. In step S40, the original substrate is cut by a width of each LED chip substrate to expose a region in which the plating layer is formed, as shown in FIG. 5B, that is, is cut to be perpendicular to the vertical insulating layer B, and is partially cut at a predetermined depth from an upper surface, preferably, half or more of an overall thickness. The partial cutting is performed using a dice sawing (a blade sawing) method. As described above, considering that aluminum is difficult to solder, step S40 is needed to plate a surface to be soldered to the printed circuit board with a material that is easy to solder simultaneously at the original substrate, for example, silver (Ag), or the like.

Figure 5D:
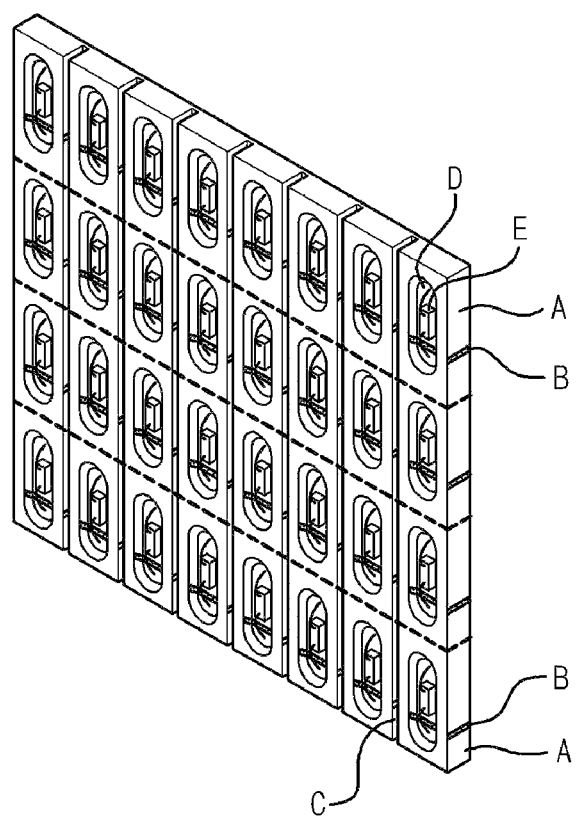

Next, in step S50, the plating layer is formed by performing electrolytic plating or electroless plating on the entire portion of the original substrate, and thus the plating layer is also formed to a partial cutting region C of the original substrate. When the plating is completed in this manner, in step S60, an LED chip E is mounted in each cavity D at the original substrate and then bonded in a wire bonding method, as shown in FIG. 5D.

Figure 5E:
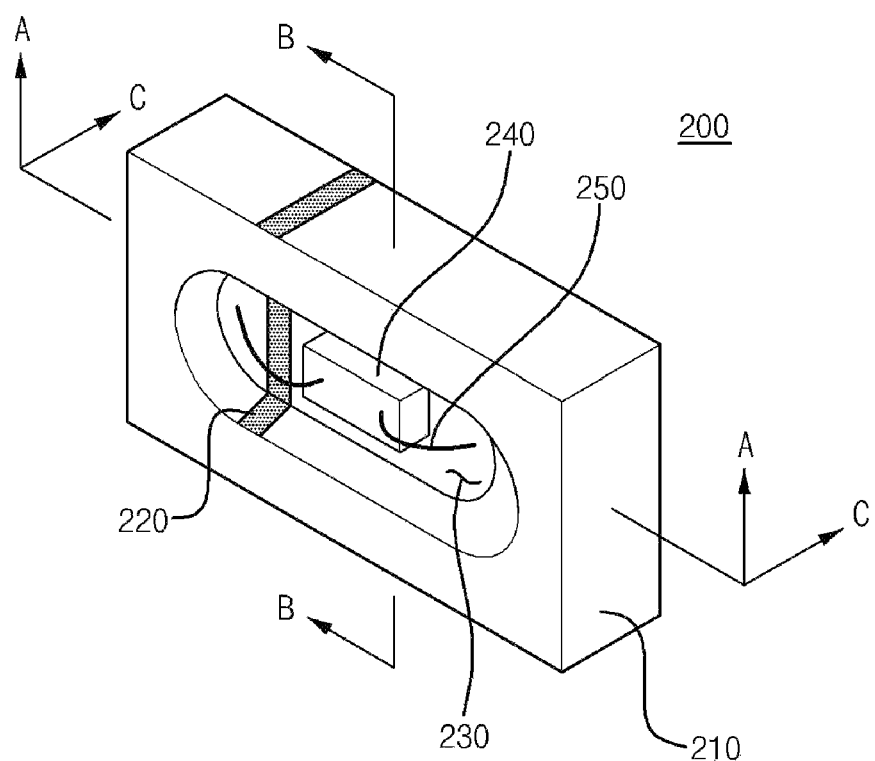

Next, in step S70, the partial cutting region C is completely cut and the original substrate is cut (cut in a horizontal direction) by a length interval of the chip substrate, and thus each LED device 200 is manufactured, as shown in FIG. 5E. The order of the complete cutting of the partial cutting region and the cutting by the length interval may be reversed. This cutting may be performed in a state in which a lower part of the original substrate is fixed with an adhesive tape, etc.

Lastly, in step S80, the plurality of LED chips are mounted on the printed circuit board at intervals while lying on their sides, and thus the manufacturing of the optical device array for a back light unit is completed.

Figure 6A:
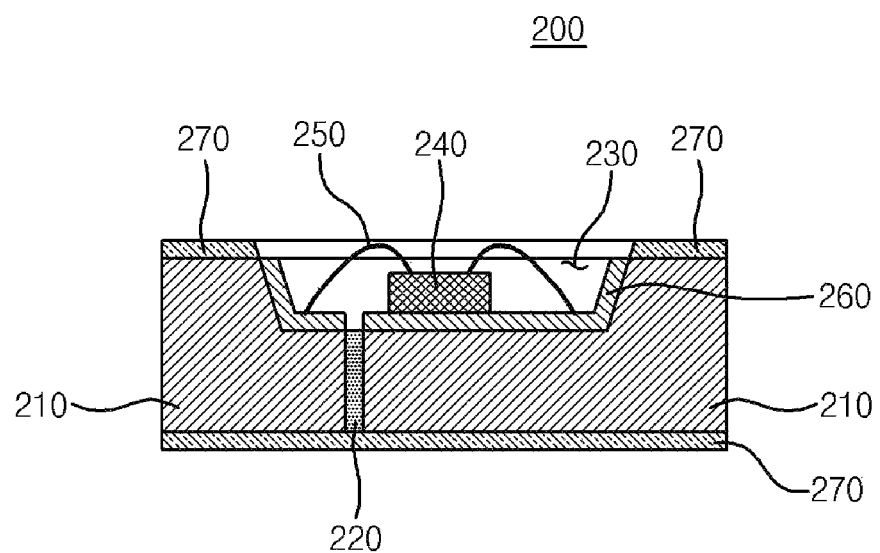
FIGS. 6A to 6C are cross-sectional views of an LED chip shown in FIG. 5E taken along lines A-A, B-B, and C-C, respectively.
Figure 6B:
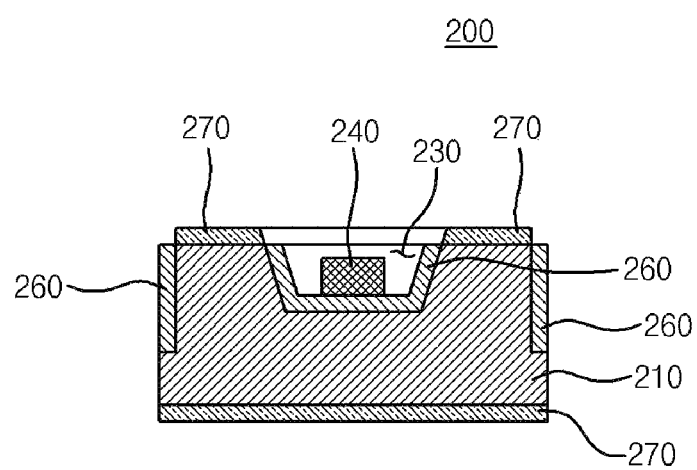
Figure 6C:
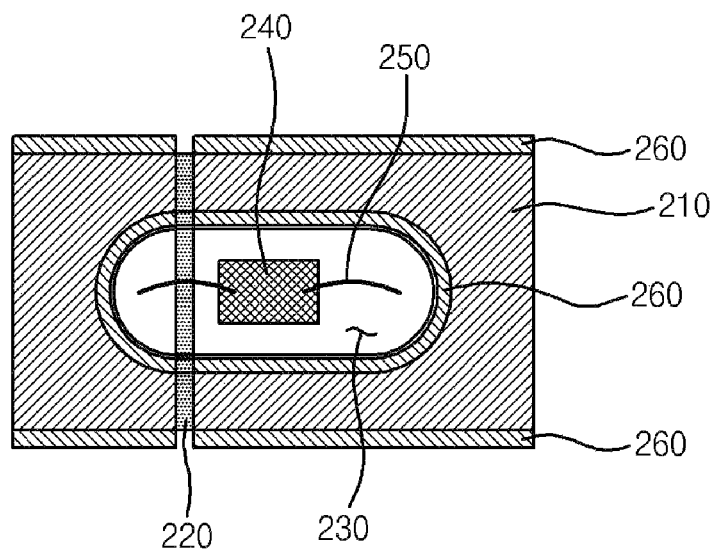

FIGS. 6A to 6C are cross-sectional views of the LED chip shown in FIG. 5E taken along lines A-A, B-B, and C-C, respectively. As shown in FIGS. 6A to 6C, a plating layer 260 is formed on a lower surface of the LED device 200 lying on its side to firmly solder it to the printed circuit board 100. As shown in FIGS. 2A and 2B, the plurality of LED chips 200 are soldered 300 to the printed circuit board 100 at intervals using the plating layer 260 as a soldering surface, and thus the manufacturing of the optical device array for a back light unit is completed.

FIGS. 7A to 7E are views of a process based on a method of manufacturing an optical device for a back light unit according to another embodiment of this invention. Thus, the same reference numerals are given to the parts that are the same as in the above-described drawings, and a description thereof will be omitted.

According to the embodiment of this invention, as shown in the dotted line block of FIG. 3, the method may further include step S30, forming a plurality of through holes between which the vertical insulating layer is interposed.

Figure 7A:
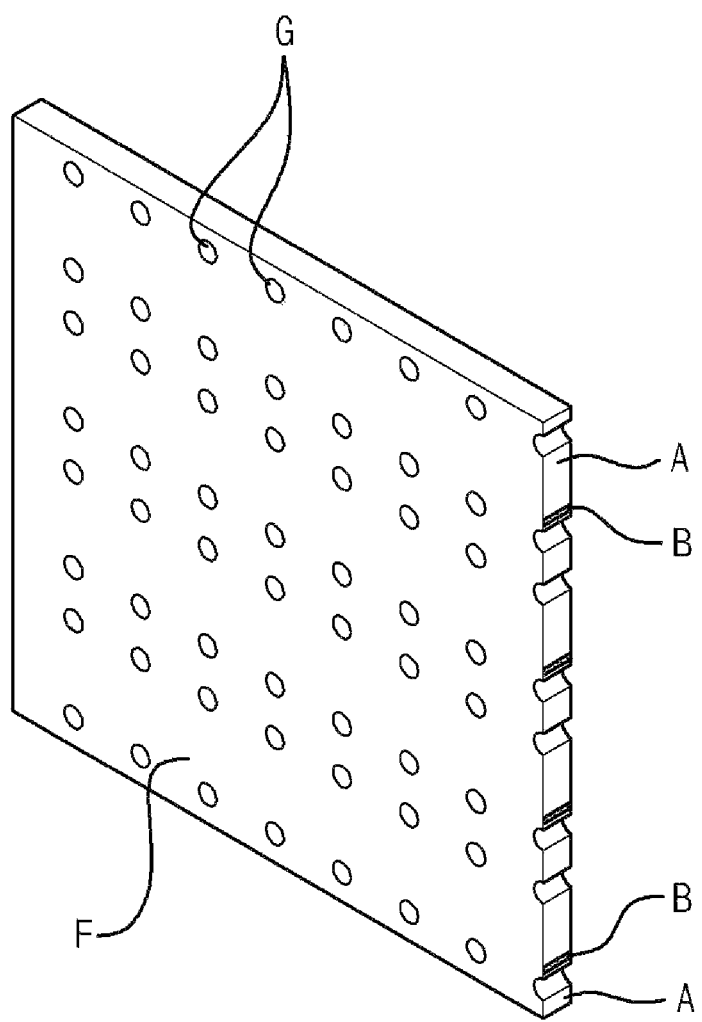
FIGS. 7A to 7E are views of a process based on a method of manufacturing an optical device for a back light unit according to another embodiment of this invention.

FIG. 7A shows a state in which the through holes G are formed on the original substrate on which the solder resist F of FIG. 5A is deposited. In step S30, a solder paste is spread into an area of the through holes G so that the LED chip is more firmly soldered to the printed circuit board. In this case, at least one of the through holes G is formed per chip substrate, and preferably, the vertical insulating layer B is interposed between them.

Figure 7B:
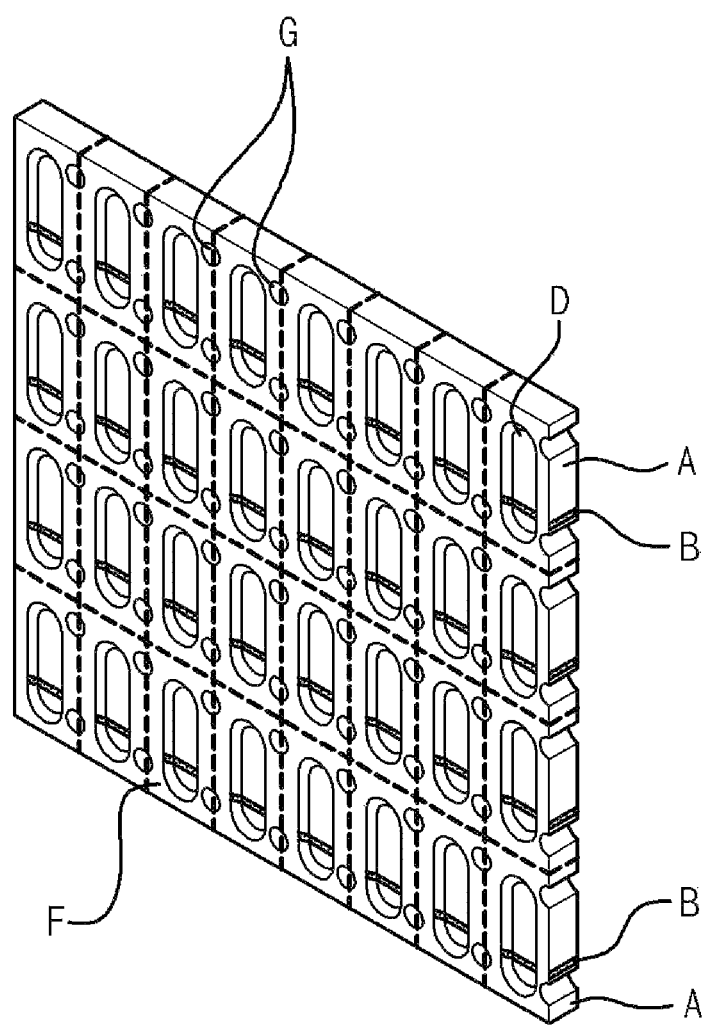
Figure 7C:
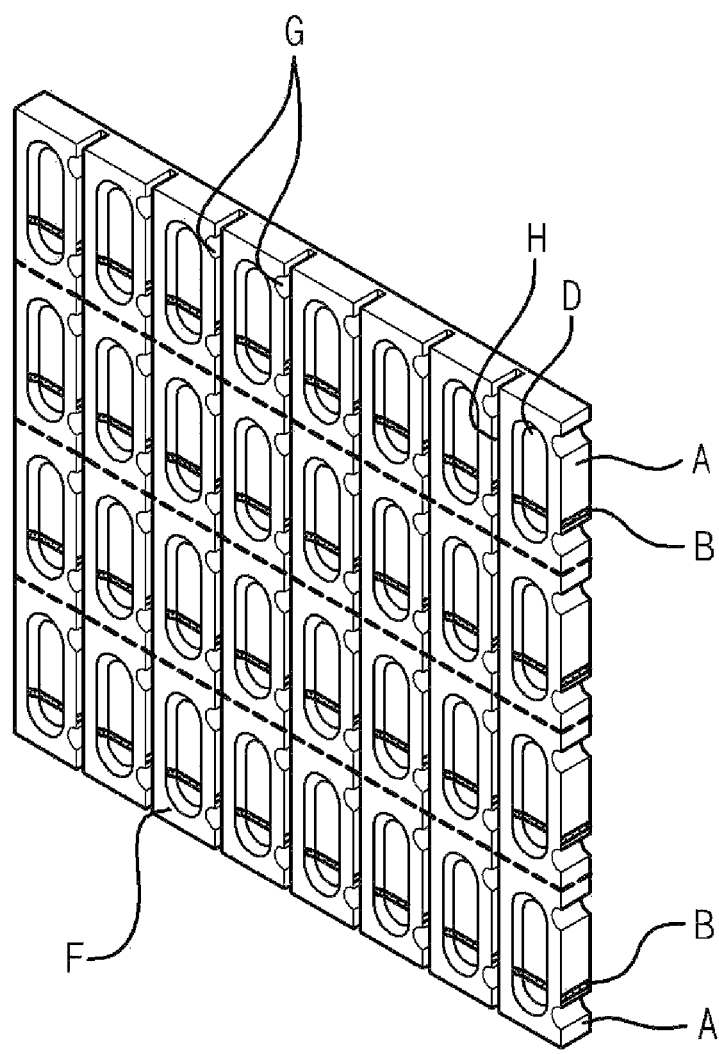
Figure 7D:
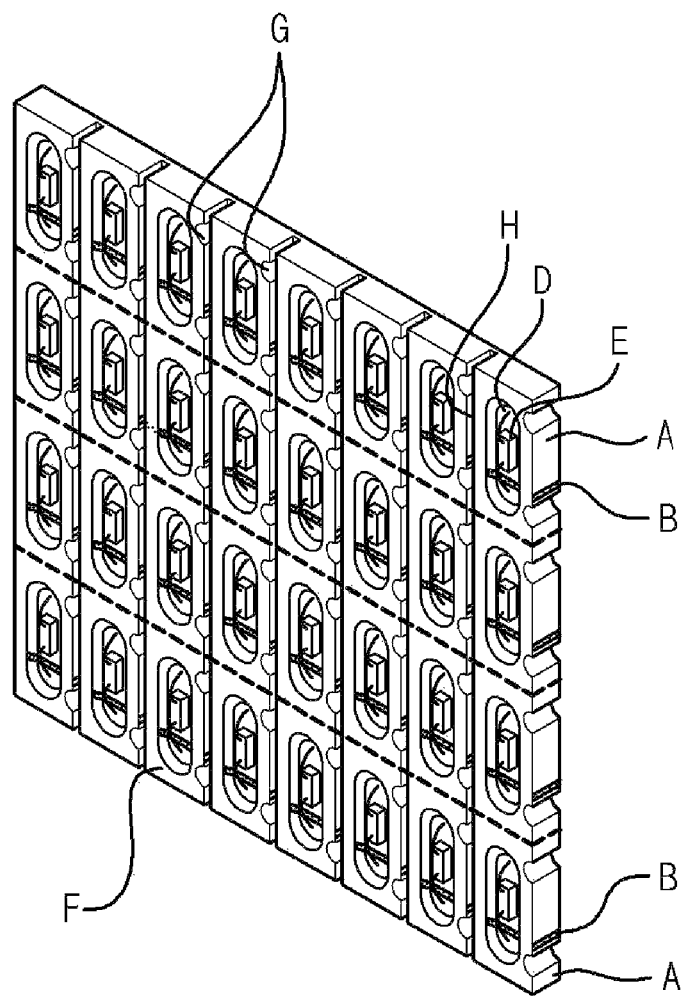

Meanwhile, in the embodiment of this invention, when step S40 is performed, as shown in the dotted line of FIG. 7B, the region passes through the through hole G by being partially cut in a vertical direction. FIG. 7C is a view showing the original substrate in which the partial cutting is completed. Next, in step S50, the plating layer is formed by performing electrolytic plating or electroless plating on the entire portion of the original substrate, and thus the plating layer is also formed to a partial cutting region H of the original substrate. When the plating is completed in this manner, in step S60, an LED chip E is mounted in each cavity D at the original substrate and then bonded in a wire bonding method, as shown in FIG. 7D.

Figure 7E:
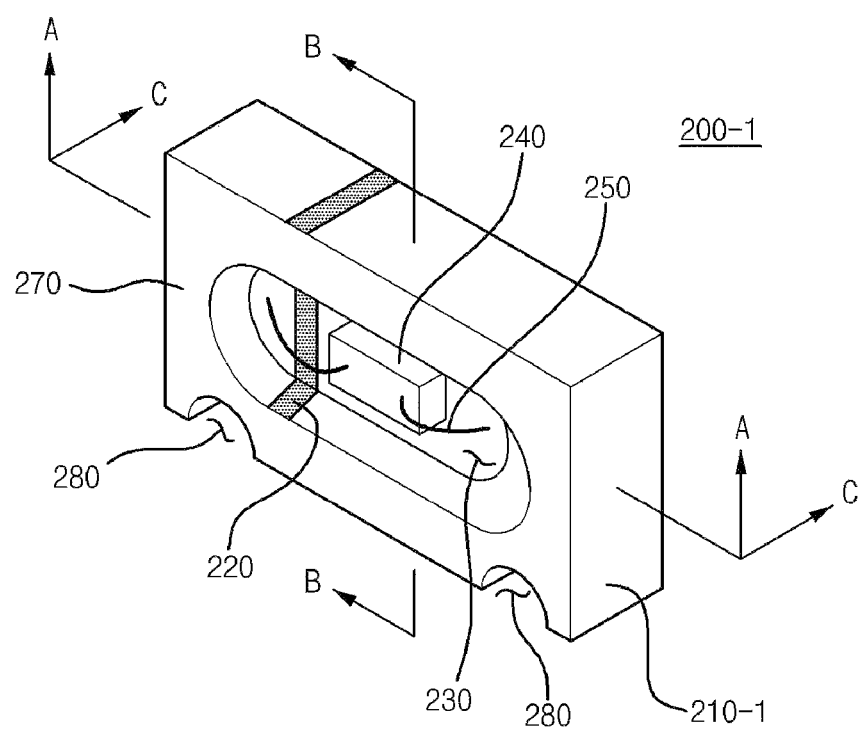

Next, in step S70, the partial cutting region H is completely cut and the original substrate is cut (cut in a horizontal direction) by a length interval of the chip substrate, and thus each LED device 200 (200-1) is manufactured, as shown in FIG. 7E. The order of the complete cutting of the partial cutting region and the cutting by the length interval may be reversed. This cutting may be performed in a state in which a lower part of the original substrate is fixed with an adhesive tape, etc.

Lastly, in step S80, the plurality of LED chips are mounted on the printed circuit board at intervals while lying on their sides, and thus the manufacturing of the optical device array for a back light unit is completed.

Figure 8A:
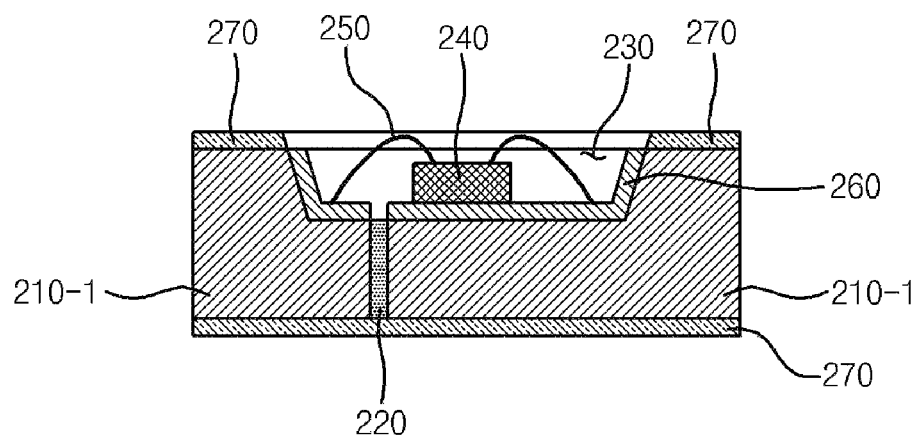
FIGS. 8A to 8C are cross-sectional views of an LED chip shown in FIG. 7E taken along lines A-A, B-B, and C-C, respectively.
Figure 8B:
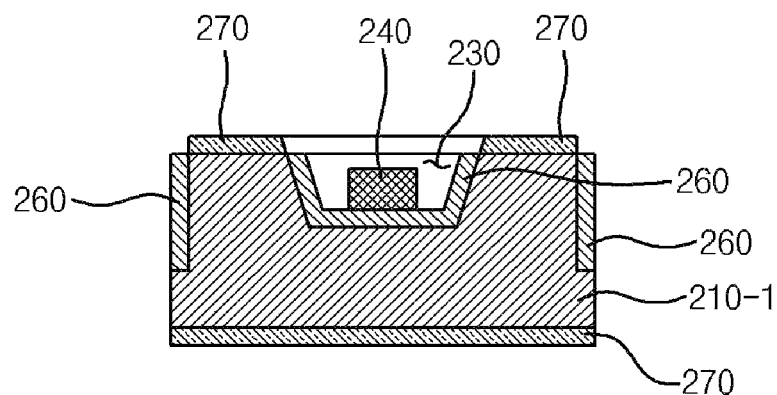
Figure 8C:
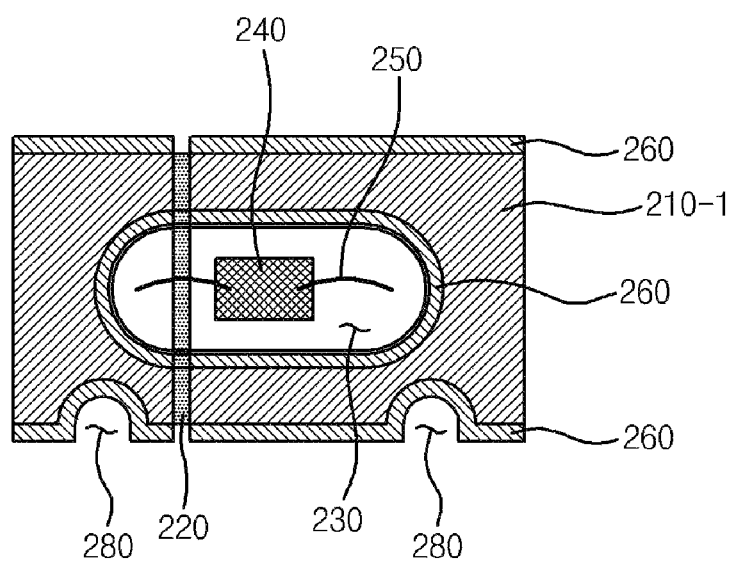

FIGS. 8A to 8C are cross-sectional views of the LED chip shown in FIG. 7E taken along lines A-A, B-B, and C-C, respectively. In. FIGS. 8A to 8C, a reference numeral 210-1 shows a chip substrate, a reference numeral 270 shows a solder resist layer, and a reference numeral 280 shows through holes.

Figure 9:
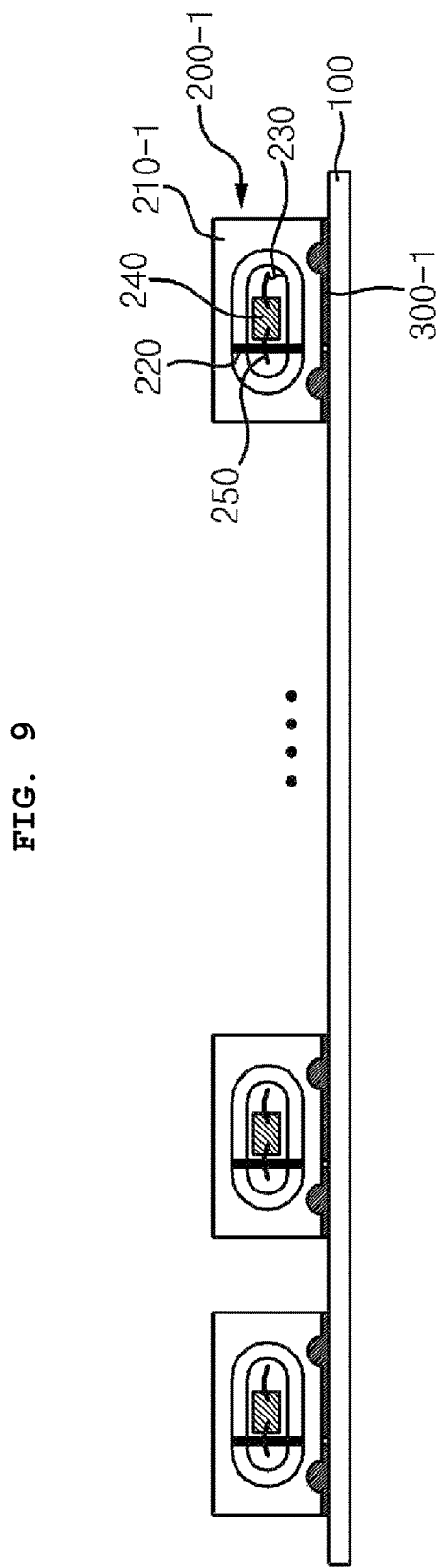
FIG. 9 is a front view showing the LED chip shown in FIG. 7E mounted on a printed circuit board.

FIG. 9 is a front view showing the LED chip shown in FIG. 7E mounted on the printed circuit board. As shown in FIG. 9, according to the LED array manufactured using the LED chip shown in FIG. 7E, a solder paste is spread into the through holes 280 formed on a lower surface of each LED device 200-1, a soldering cross-sectional area is increased, and thus each LED device 200-1 is more firmly soldered to the printed circuit board 300. Furthermore, since the solder resist is deposited on a front surface and a back surface of the LED chip substrate 210-1 (based on FIG. 9), the solder paste does not climb up the front surface or the back surface of the chip substrate in the soldering process.

Figure 10:
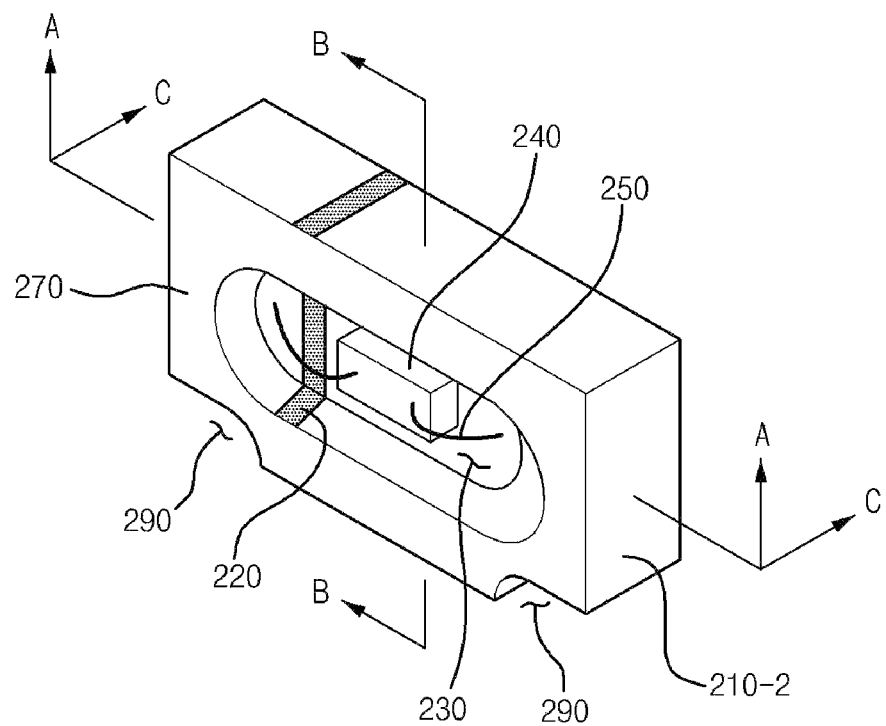
FIG. 10 is a perspective view showing an LED chip manufactured by a manufacturing method according to still another embodiment of this invention.
Figure 11A:
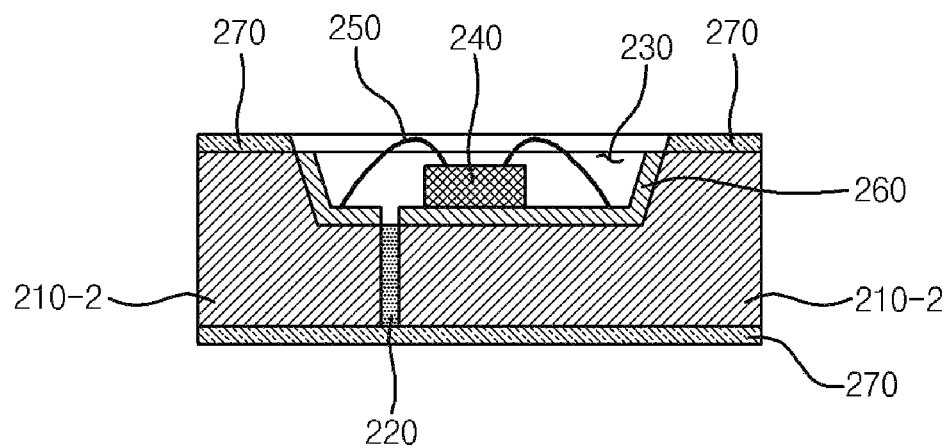
FIGS. 11A to 11C are cross-sectional views of an LED chip shown in FIG. 10 taken along lines A-A, B-B, and C-C, respectively.
Figure 11B:
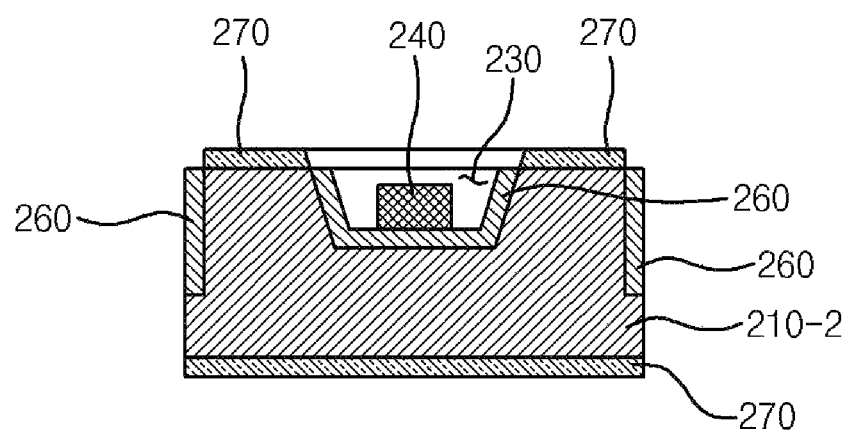
Figure 11C:
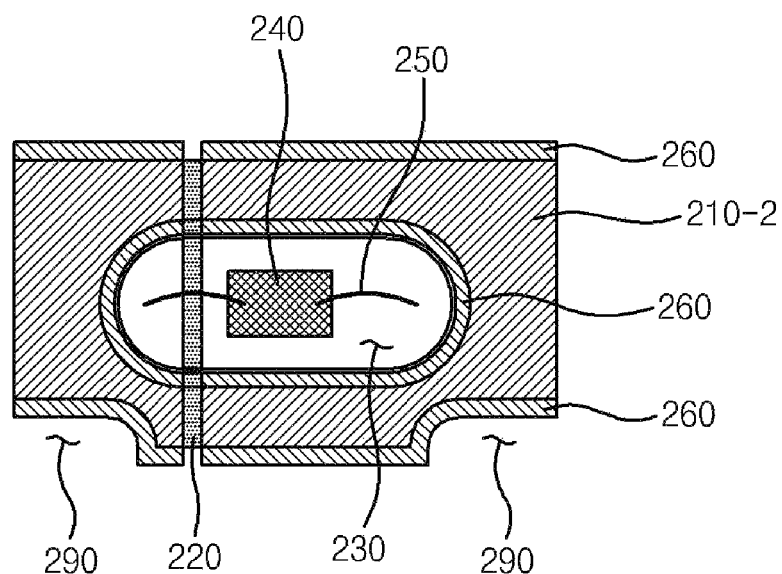

FIG. 10 is a perspective view showing an LED chip manufactured by a manufacturing method according to still another embodiment of this invention. FIGS. 11A to 11C are cross-sectional views of the LED chip shown in FIG. 10 taken along lines A-A, B-B, and C-C, respectively. Thus, the same reference numerals are given to the parts that are the same as in the above-described drawings, and a description thereof will be omitted. As shown in FIGS. 10 and 11A to 11C, in the embodiment of this invention, the through holes are formed in long hole shapes in step S20, unlike the embodiment of FIG. 7E. In the drawing, a reference numeral 210-2 shows an LED chip substrate and a reference numeral 290 shows slot parts.

Figure 12:
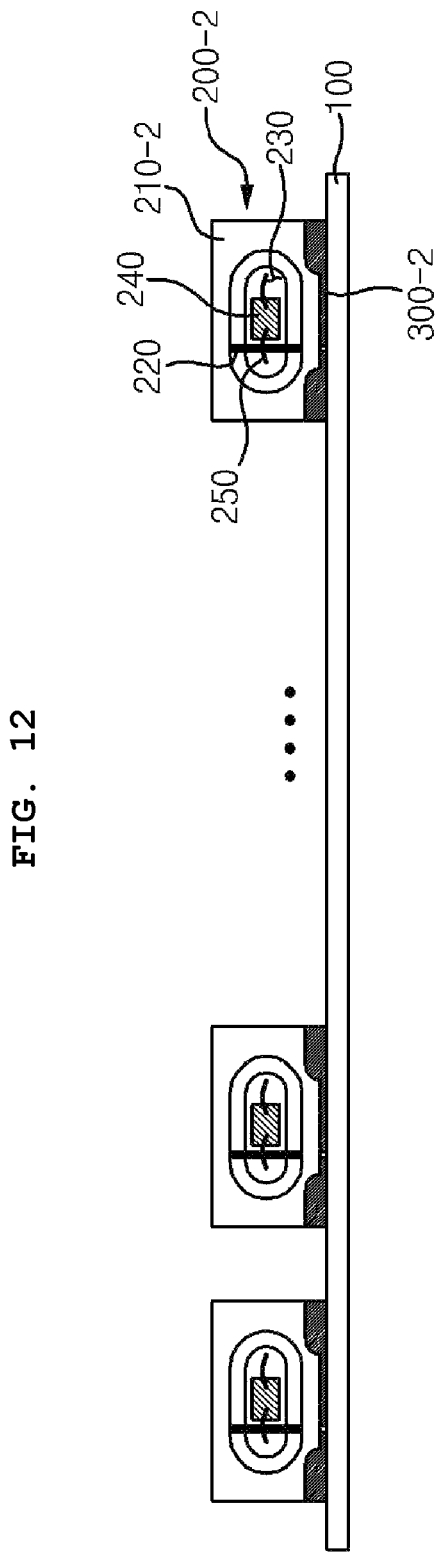
FIG. 12 is a front view showing the LED chip shown in FIG. 10 mounted on a printed circuit board.

FIG. 12 is a front view showing the LED chip shown in FIG. 10 mounted on the printed circuit board. As shown in FIG. 12, according to the LED array manufactured using the LED chip shown in FIG. 10, a solder paste is spread into the slot parts 290 formed on a lower surface of each LED device 200-2, a soldering cross-sectional area is increased, and thus each LED device 200-2 is more firmly soldered to the printed circuit board 300. Furthermore, since the solder resist is deposited on a front surface and a back surface of the LED chip substrate 210-2 (based on FIG. 12), the solder paste does not climb up the front surface or the back surface of the chip substrate 210-2 in the soldering process.

Figure 13:
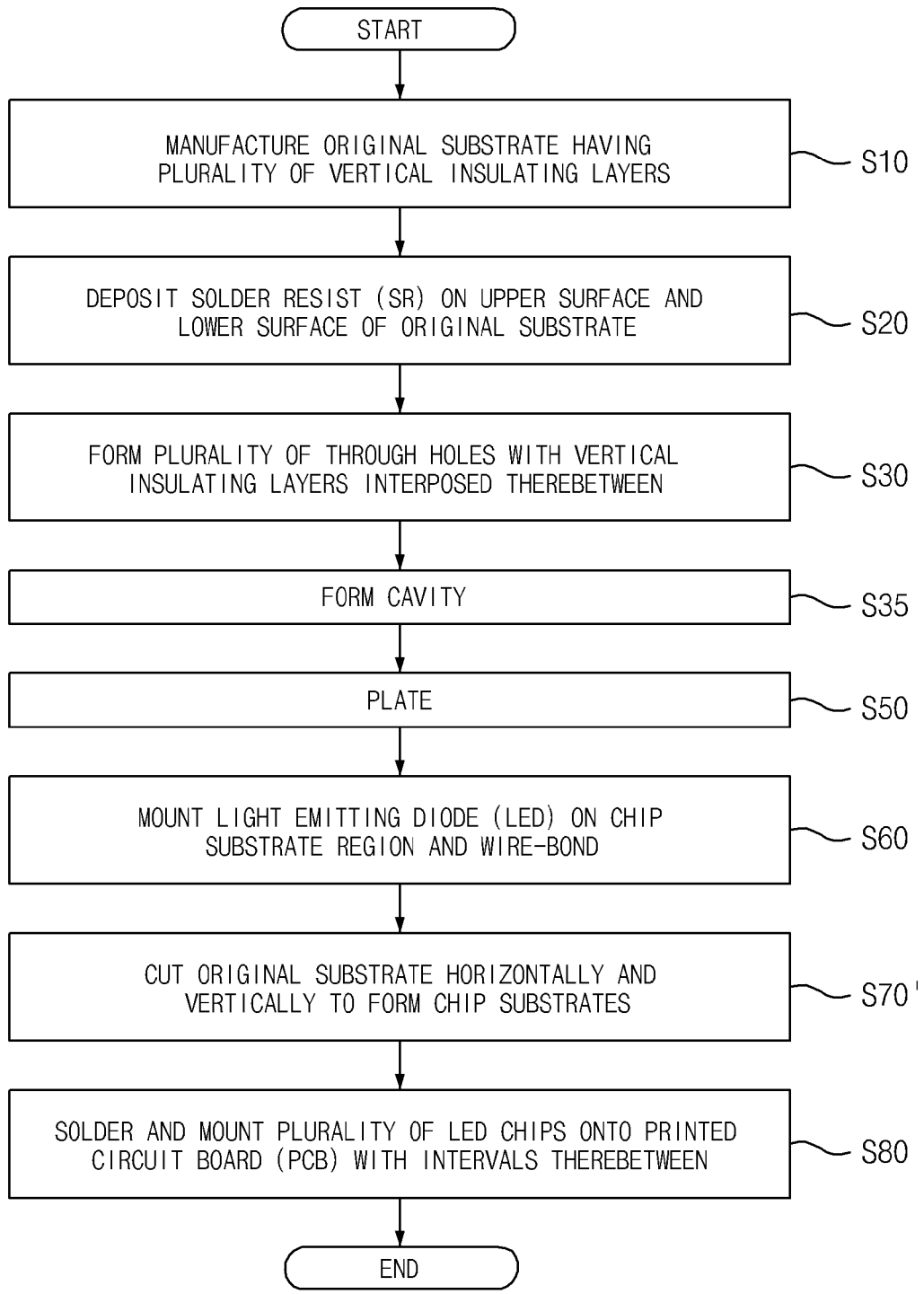
FIG. 13 is a flowchart for describing a method of manufacturing an optical device array for a back light unit according to another embodiment of this invention.

FIG. 13 is a flowchart for describing a method of manufacturing the optical device array for a back light unit according to another embodiment of this invention. FIGS. 14A to 14D are views of a process based on the manufacturing method shown in FIG. 13. Thus, the same reference numerals are given to the parts that are the same as in the above-described drawings, and a description thereof will be omitted.

Figure 14A:
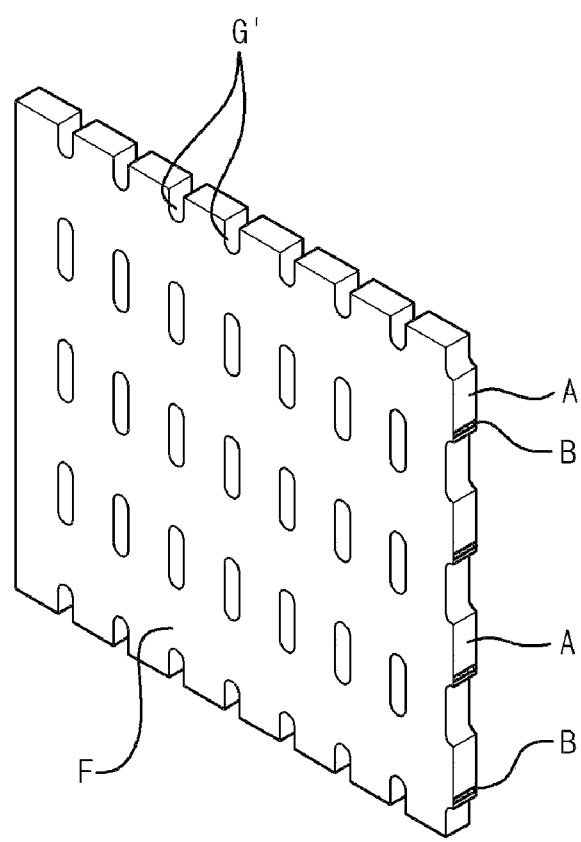
FIGS. 14A to 14D are views of a process based on the manufacturing method shown in FIG. 13.

As shown in FIG. 13, according to the embodiment of this invention, an original substrate is manufactured in step S10, a solder resist is deposited on an upper surface and a lower surface of the original substrate as shown in FIG. 5A in step S20, and a plurality of through holes, slots G' in the embodiment of this invention, between which the vertical insulating layer is interposed are formed as shown in FIG. 14A in step S30.

Figure 14B:
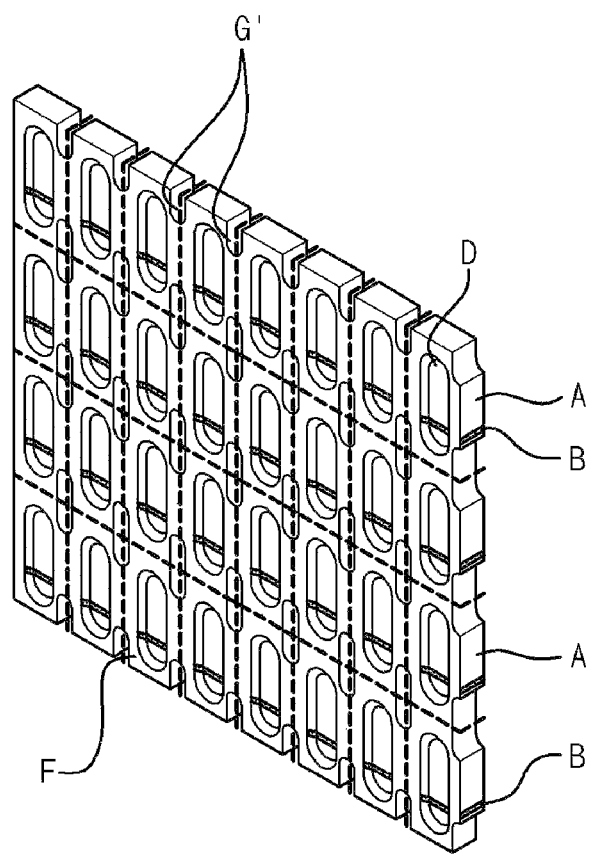

Next, in step S35, a cavity D a predetermined depth from the upper surface of the chip substrate is formed in each chip substrate region, as shown in FIG. 14B. In step S50, a plating process is performed. Thus, as a plating layer is formed on a region in which the solder paste is not deposited, that is, the plating layer is formed on the slots G' and the cavity D only, an amount of plating material may be reduced compared to the embodiment of this invention in FIGS. 7A to 7E.

Figure 14C:
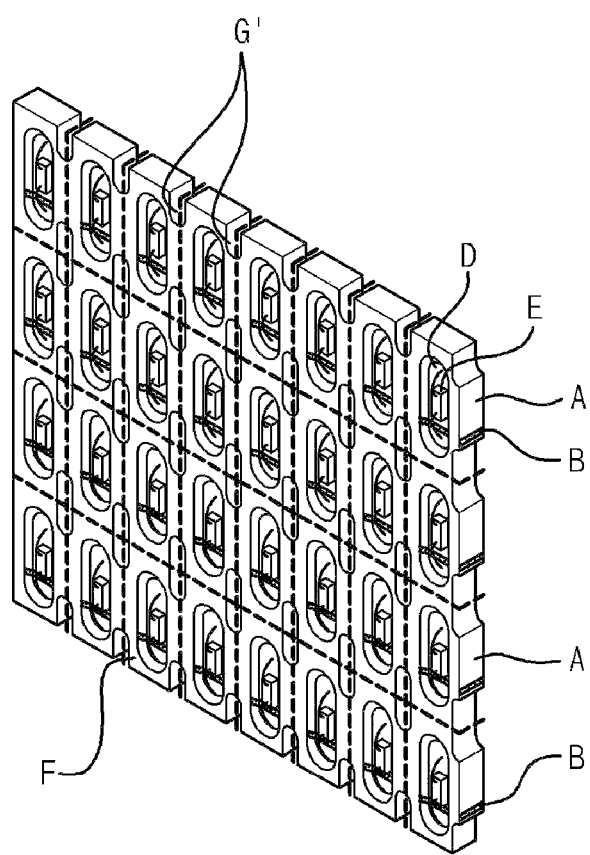
Figure 14D:
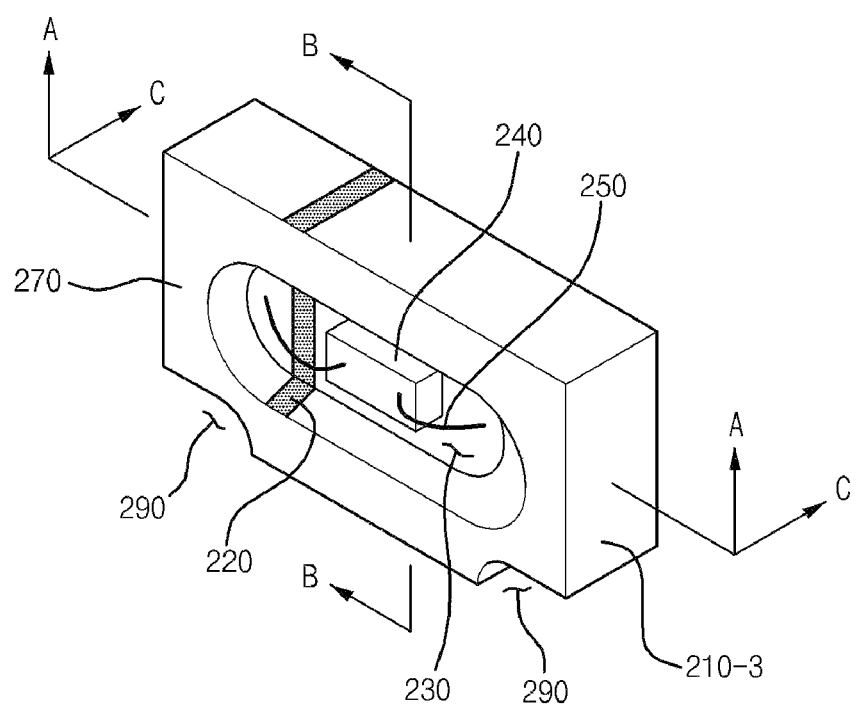

Next, in step S60, the LED chip E is mounted in the cavity D and then bonded in a wire bonding method as shown in FIG. 14C. In step S70', the original substrate is horizontally and vertically cut and divided into each chip substrate, and thus each LED device 200-3 is manufactured as shown in FIG. 14D. In this process, the original substrate is cut so that a cutting line in a vertical direction passes through the slot G' as shown in a dotted line of FIG. 14C.

Lastly, in step S80, the plurality of LED chips are mounted on the printed circuit board at intervals while lying on their sides, and thus the manufacturing of the optical device array for a back light unit is completed.

Figure 15A:
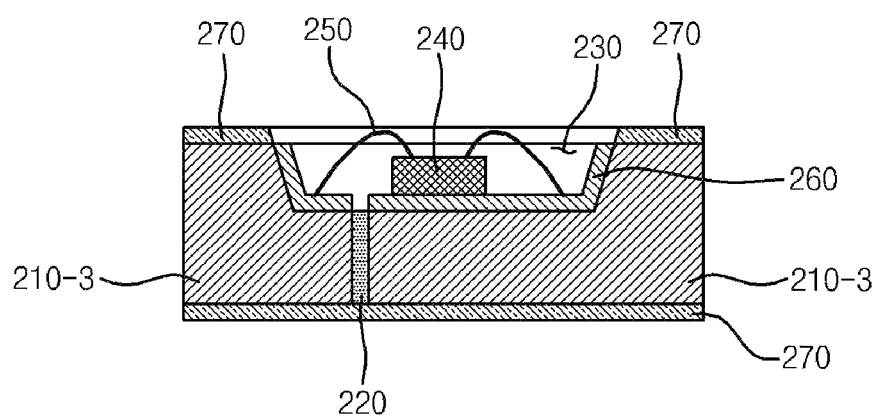
FIGS. 15A to 15C are cross-sectional views of an LED chip shown in FIG. 14D taken along lines A-A, B-B, and C-C, respectively.
Figure 15B:
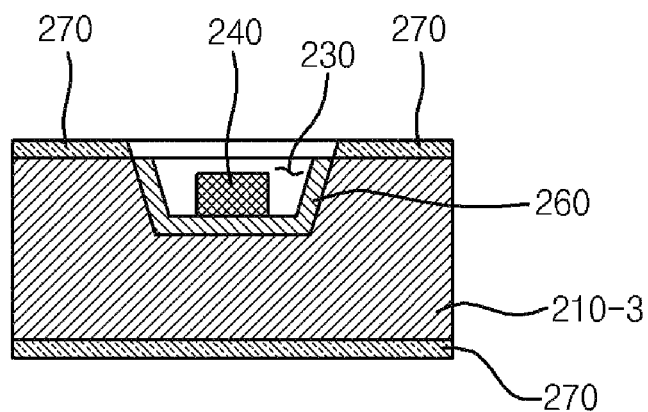
Figure 15C:
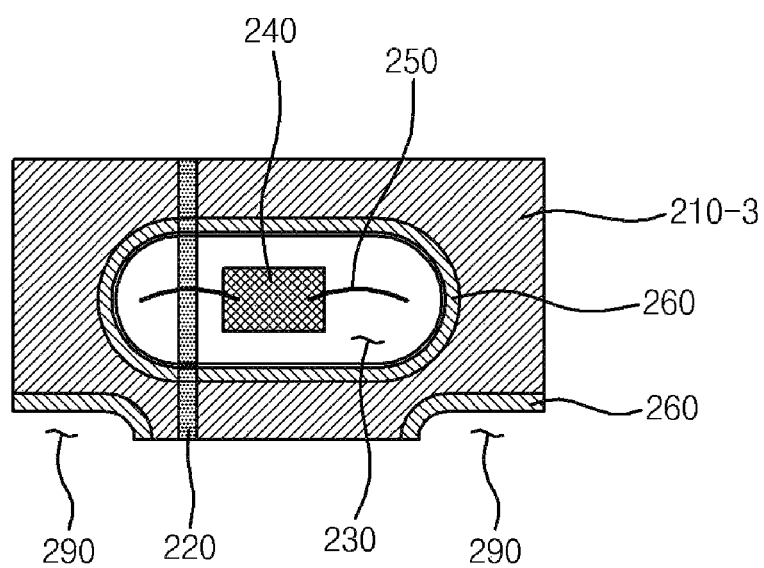

FIGS. 15A to 15C are cross-sectional views of the LED chip shown in FIG. 14D taken along lines A-A, B-B, and C-C, respectively. FIG. 16 is a front view showing the LED chip shown in FIG. 14D mounted on the printed circuit board. As shown in FIGS. 15A to 15C and 16, according to the embodiment of this invention, it may be seen that the plating layer is formed only on the slot parts 290 of a printed circuit board bonding surface (a lower surface) of the LED device 200-3.

The method of manufacturing the optical device for a back light unit according to the embodiment of this invention, and the optical device and the optical device array manufactured by the method are not limited to the above-described embodiments, and may be variously modified within the spirit of this invention. For example, the solder paste depositing process may be omitted, or may be performed only on one surface of the original substrate, for example, a lower surface, unlike the above-described embodiments. In addition, in FIG. 3, the order of the cavity forming process (S35) and the through hole forming process (S30) may be reversed. On the other hand, the cavity forming process (S35) may be immediately performed after the through hole forming process (S30) and the partial cutting process (S40).

Further, the cavity forming process may be omitted. In this case, before performing step S20, the LED chip is mounted, a region to be bonded in a wire bonding method is masked, and a wire bonding method may be performed on the LED chip in a state in which the solder resist is not deposited on the region. In this case, the process of depositing the solder resist may be performed by silk screen printing in which a mask is formed.

The invention claimed is:

1. A method of manufacturing an optical device for a back light unit, the method comprising steps of:
   (a) preparing an original substrate having vertical insulating layers interposed therebetween, the original substrate having an upper surface;
   (a1) forming a cavity including a groove at a predetermined depth from the upper surface and including the vertical insulating layers on the original substrate;
   (pb1) depositing a solder resist at least on the upper surface of the original substrate;
   (pb2) forming through holes between which the vertical insulating layers are interposed;
   (b) partially cutting the original substrate, along the through holes, to a predetermined depth from the upper surface thereof such that the cut portion is orthogonal at least to the vertical insulation layers, and exposing a region where a plating layer for soldering is to be formed;
   (c) performing plating;
   (d) mounting, inside the cavity, optical device chips on a plurality of chip substrate regions divided to include the vertical insulating layers; and
   (e) cutting each chip substrate region;
   wherein said step (pb1) is performed after said step (a) and before said step (b); and
   wherein said step (a1) is performed before said step (pb1) and before said step (c).

2. The method of claim 1, wherein, in said step (pb1), a solder paste is deposited at least on the upper surface of the original substrate, and
   the solder paste is deposited in a state in which a region on which the optical device chips are mounted is masked.

* * * * *